US011454670B2

(12) United States Patent
Yamada

(10) Patent No.: US 11,454,670 B2
(45) Date of Patent: Sep. 27, 2022

(54) SUBSTRATE INSPECTION DEVICE AND SUBSTRATE INSPECTION METHOD

(71) Applicant: Tokyo Electron Limited, Tokyo (JP)

(72) Inventor: Hiroshi Yamada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 616 days.

(21) Appl. No.: 16/336,509

(22) PCT Filed: Aug. 25, 2017

(86) PCT No.: PCT/JP2017/031503
§ 371 (c)(1),
(2) Date: Mar. 26, 2019

(87) PCT Pub. No.: WO2018/061609
PCT Pub. Date: Apr. 5, 2018

(65) Prior Publication Data
US 2021/0278455 A1 Sep. 9, 2021

(30) Foreign Application Priority Data

Sep. 28, 2016 (JP) .............................. JP2016-189999

(51) Int. Cl.
G01R 1/02 (2006.01)
G01R 1/067 (2006.01)
(Continued)

(52) U.S. Cl.
CPC ..... *G01R 31/2887* (2013.01); *G01R 1/07342* (2013.01); *G01R 31/2891* (2013.01)

(58) Field of Classification Search
CPC . G01R 1/02; G01R 1/04; G01R 1/067; G01R 1/073; G01R 31/00; G01R 31/02; G01R 31/20; G01R 31/26; G01R 31/28
See application file for complete search history.

(56) References Cited

U.S. PATENT DOCUMENTS

| 2012/0194213 A1* | 8/2012 | Komatsu | G01R 31/2887 324/756.03 |
| 2015/0168449 A1* | 6/2015 | Yamada | G01R 1/07307 324/755.04 |
| 2015/0260788 A1* | 9/2015 | Yamada | G01R 31/2893 324/750.25 |

FOREIGN PATENT DOCUMENTS

| JP | 2002-022768 A | 1/2002 |
| JP | 2011-198243 A | 10/2011 |
(Continued)

OTHER PUBLICATIONS

International Search Report for International Application No. PCT/JP2017/031503, dated Nov. 21, 2017.

Primary Examiner — Neel D Shah
(74) Attorney, Agent, or Firm — Pearne & Gordon LLP

(57) ABSTRACT

A wafer inspection device 10 is provided with a chuck top 20 on which a wafer W having semiconductor devices formed thereon is placed, a probe card 18 having multiple contact probes 28 protruding toward the wafer W, a pogo frame 23 for holding the probe card 18, a cylindrical internal bellows 26 configured to suspend from the pogo frame 23 to surround the contact probes 28, and a cylindrical external bellows 27 configured to suspend from the pogo frame 23 to surround the internal bellows 26. When the chuck top 20 approaches the probe card 18 and the contact probes 28 are brought into contact with the devices, the internal bellows 26 and the external bellows 27 come in contact with the chuck top 20, a sealing space P is formed between the internal bellows 26 and the external bellows 27, and the sealing space P is compressed.

9 Claims, 9 Drawing Sheets

(51) Int. Cl.
*G01R 1/073* (2006.01)
*G01R 31/20* (2006.01)
*G01R 31/26* (2020.01)
*G01R 31/28* (2006.01)

(56) References Cited

FOREIGN PATENT DOCUMENTS

| | | |
|---|---|---|
| JP | 2013-254812 A | 12/2013 |
| JP | 2014-002171 A | 1/2014 |
| KR | 10-2015-022807 A | 3/2015 |

* cited by examiner

SUBSTRATE INSPECTION DEVICE AND SUBSTRATE INSPECTION METHOD

CROSS-REFERENCE TO RELATED APPLICATION

This Application is a U.S. national phase application under 35 U.S.C. § 371 of PCT Application No. PCT/JP2017/031503 filed on Aug. 25, 2017, which claims the benefit of Japanese Patent Application No. 2016-189999 filed on Sep. 28, 2016, the entire disclosures of which are incorporated herein by reference.

TECHNICAL FIELD

The various embodiments described herein pertain generally to a substrate inspection device and a substrate inspection method.

BACKGROUND ART

In order to inspect a wafer on which multiple semiconductor devices are formed, a prober has been used as an inspection device. The prober is provided with a probe card facing the wafer, and the probe card is provided with a plate-shaped base member and multiple column-shaped contact probes (probe needles) as contact terminals respectively arranged on the base member to face electrode pads and solder bumps in the semiconductor devices on the wafer (see, for example, Patent Document 1).

In the prober, the contact probes of the probe card are brought into contact with the electrode pads and the solder bumps in the semiconductor devices by pressing the wafer against the probe card with a stage configured to place the wafer thereon, and then, an electric current is allowed to flow from the contact probes to electric circuits of the semiconductor devices connected with the electrode pads and the solder bumps, so that electrical characteristics, such as a conducting state, of the electric circuits can be inspected.

Further, as shown in FIG. 12A, there has been suggested a substrate inspection device. In the substrate inspection device, a wafer W is placed on a chuck 100 formed as a plate-shaped member, a cylindrical bellows 102 that expands and contracts freely surrounds a space between the chuck 100 and a probe card 101 to form a closed space S, and the wafer W is attracted toward the probe card 101 (FIG. 12B) for each chuck 100 by decompressing and contracting the closed space S to bring the wafer W into contact with the probe card 101 (see, for example, Patent Document 2). In this substrate inspection device, the chuck 100 is supported by an aligner 103 until the wafer W is brought into contact with the probe card 101, but after the wafer W is brought into contact with the probe card 101, the aligner 103 separates from the chuck 100 (FIG. 12C).

PRIOR ART DOCUMENT

Patent Document 1: Japanese Patent Laid-open Publication No. 2002-022768 Patent Document 2: Japanese Patent Laid-open Publication No. 2013-254812

DISCLOSURE OF THE INVENTION

Problems to be Solved by the Invention

However, on the wafer W, semiconductor devices as inspection targets may be formed in an offset position with respect to a center of the wafer W. Typically, the wafer W is placed on the chuck 100 to be concentric with the chuck 100. Therefore, in this case, a resultant force of reaction forces from the contact probes 104 of the probe card 101 is applied to the offset position with respect to a center of the chuck 100, and, thus, a moment is generated in the chuck 100. Here, as described above, if the aligner 103 is provided separately from the chuck 100, the corresponding moment generated in the chuck 100 cannot be removed by the aligner 103, so that the chuck 100 may be rotated and inclined (FIG. 12D).

As a result, the contact probes 104 cannot be properly brought into contact with the electrode pads and the solder bumps of the wafer W, and, thus, the electrical characteristics of the semiconductor devices may not be inspected accurately.

The purpose of the exemplary embodiment described herein is to provide a substrate inspection device and a substrate inspection method capable of accurately carrying out inspection.

Means for Solving the Problems

There is provided a substrate inspection device, including a plate-shaped member on which a substrate having devices formed thereon is placed and a probe card which is placed above the plate-shaped member to face the plate-shaped member and has multiple needle-shaped contact probes protruding toward the substrate, in which the contact probes are brought into contact with the devices by allowing the plate-shaped member to approach the probe card. The substrate inspection device includes a cylindrical first bellows configured to expand and contract and configured to suspend to surround the contact probes; and a cylindrical second bellows configured to expand and contract and configured to suspend to surround the first bellows. When the plate-shaped member approaches the probe card, the first bellows and the second bellows are brought into contact with the plate-shaped member and a sealing space is formed between the first bellows and the second bellows, and the sealing space is compressed.

There is provided a substrate inspection method of allowing, in a substrate inspection device including a plate-shaped member on which a substrate having devices formed thereon is placed and a probe card which is placed above the plate-shaped member to face the plate-shaped member and has multiple needle-shaped contact probes protruding toward the substrate, the plate-shaped member to approach the probe card to bring the contact probes into contact with the devices. The substrate inspection method includes placing a cylindrical first bellows configured to expand and contract and configured to suspend to surround the contact probes and placing a cylindrical second bellows configured to expand and contract and configured to suspend to surround the first bellows; bringing, when the plate-shaped member approaches the probe card, the first bellows and the second bellows into contact with the plate-shaped member to form a sealing space between the first bellows and the second bellows; and compressing the sealing space.

There is provided a substrate inspection device, including a plate-shaped member on which a substrate having devices formed thereon is placed and a probe card which is placed above the plate-shaped member to face the plate-shaped member and has multiple needle-shaped contact probes protruding toward the substrate, in which the contact probes are brought into contact with the devices by allowing the plate-shaped member to approach the probe card. The substrate inspection device includes a cylindrical main bellows configured to expand and contract and configured to suspend to surround the contact probes; and at least one cylindrical auxiliary bellows configured to expand and contract and configured to be placed around the main bellows. When the plate-shaped member approaches the probe card, the auxiliary bellows is brought into contact with the plate-shaped member, an inside of the auxiliary bellows is compressed so that the auxiliary bellows applies a pressing force to the plate-shaped member.

There is provided a substrate inspection method of allowing, in a substrate inspection device including a plate-shaped member on which a substrate having devices formed thereon is placed and a probe card which is placed above the plate-shaped member to face the plate-shaped member and has multiple needle-shaped contact probes protruding toward the substrate, the plate-shaped member to approach the probe card to bring the contact probes into contact with the devices. The substrate inspection method includes placing a cylindrical main bellows configured to expand and contract and configured to suspend to surround the contact probes and placing at least one cylindrical auxiliary bellows configured to expand and contract around the main bellows; and bringing, when the plate-shaped member approaches the probe card, the auxiliary bellows into contact with the plate-shaped member and compressing an inside of the auxiliary bellows to apply a pressing force from the auxiliary bellows to the plate-shaped member.

Effect of the Invention

According to the exemplary embodiment as described above, the sealing space formed between the first bellows and the second bellows in contact with the plate-shaped member is compressed. Therefore, the pressing force from the sealing space as well as the reaction forces from the contact probes are applied to the plate-shaped member. Thus, even if the resultant force of the reaction forces from the contact probes are applied to the offset position with respect to the center of the plate-shaped member, the effect of the resultant force of the reaction forces from the contact probes on the plate-shaped member can be reduced by the pressing force from the sealing space. As a result, the moment caused by the resultant force of the reaction forces from the contact probes can be reduced, so that it is possible to suppress the plate-shaped member from being inclined. Accordingly, it is possible to accurately carry out the inspection of the substrate placed on the plate-shaped member.

DETAILED DESCRIPTION

Hereinafter, various exemplary embodiments will be described with reference to accompanying drawings.

A wafer inspection device as a substrate inspection device according to the present exemplary embodiment will be described first.

Figure 1:
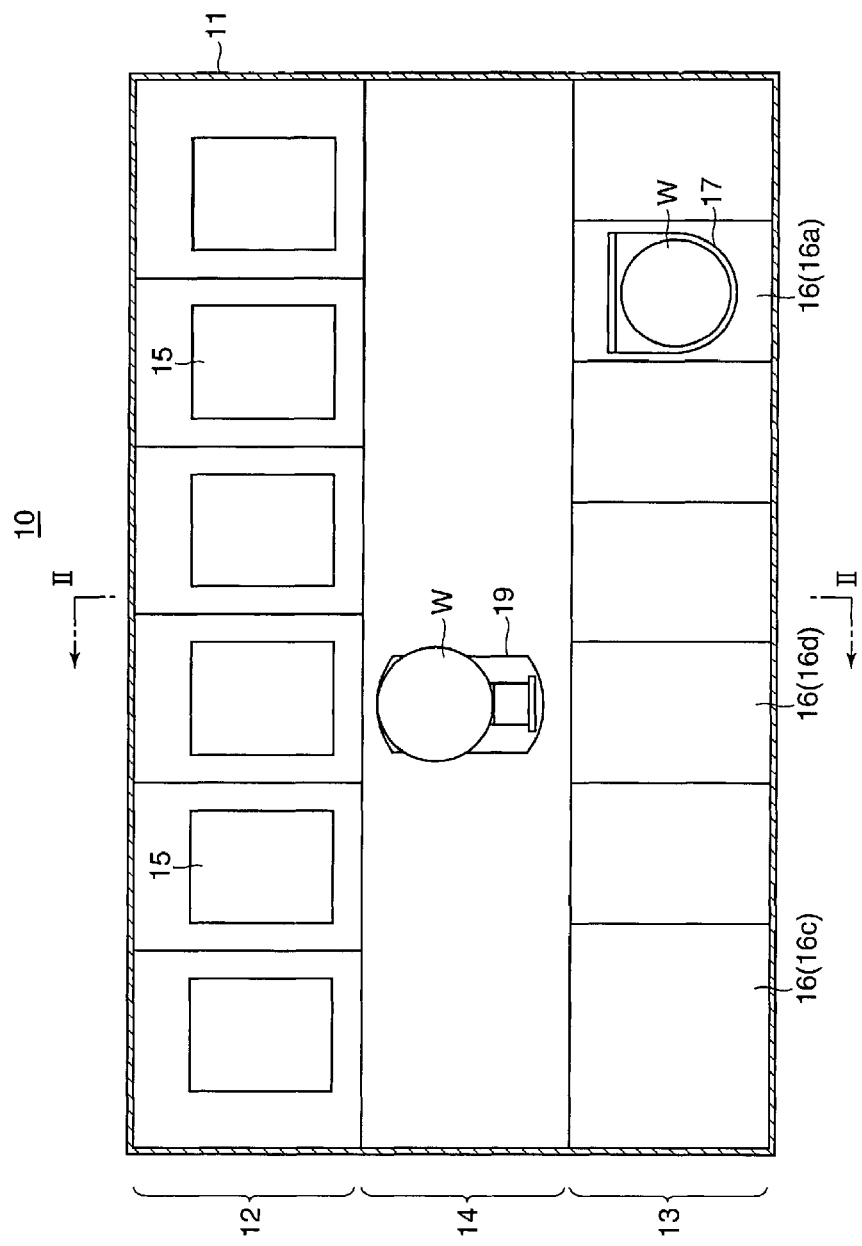
FIG. 1 is a horizontal cross sectional view schematically illustrating a configuration of a wafer inspection device as a substrate inspection device according to an exemplary embodiment.
Figure 2:
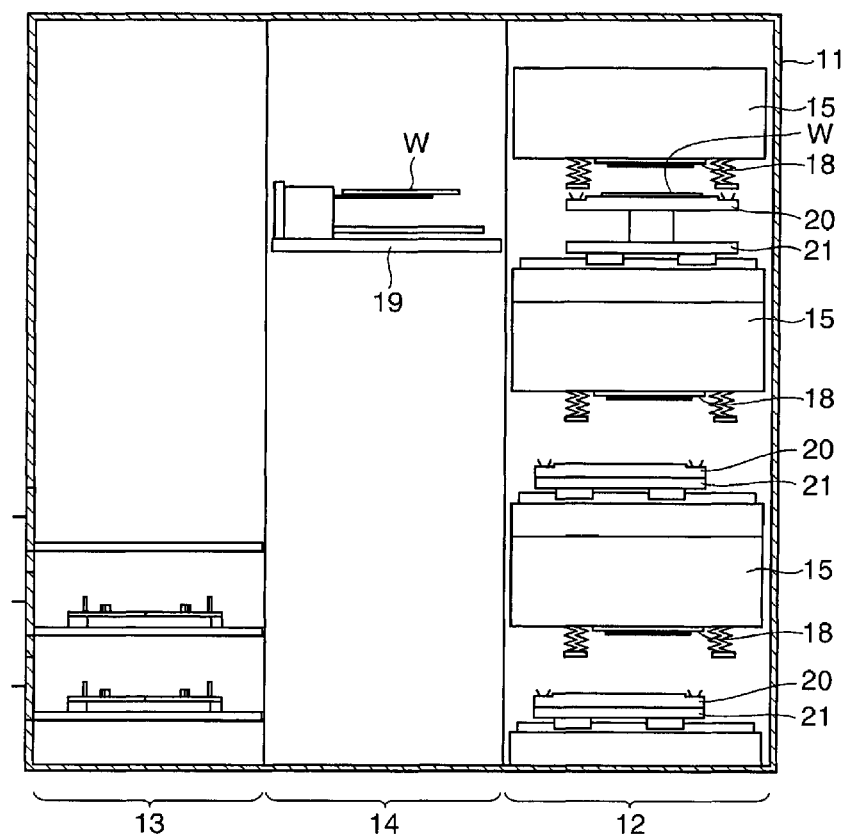
FIG. 2 is a longitudinal cross sectional view taken along a line II-II in FIG. 1.

FIG. 1 is a horizontal cross sectional view schematically illustrating a configuration of a wafer inspection device as a substrate inspection device according to an exemplary embodiment, and FIG. 2 is a longitudinal cross sectional view taken along a line II-II in FIG. 1.

In FIG. 1 and FIG. 2, a wafer inspection device 10 is provided with an inspection chamber 11, and the inspection chamber 11 includes an inspection section 12 in which electrical characteristics of semiconductor devices on a wafer W are inspected; a loading/unloading section 13 in which the wafer W is carried into/from the inspection chamber 11; and a transfer section 14 provided between the inspection section 12 and the loading/unloading section 13. In the inspection section 12, multiple testers 15 as interfaces for wafer inspection are arranged and a circular plate-shaped probe card 18 is mounted on a lower portion of each of the testers 15.

The loading/unloading section 13 is divided into multiple accommodation spaces 16, a port 16a configured to receive a container configured to accommodate multiple wafers W, for example, a FOUP 17; a loader 16c where the probe card 18 is carried-in or carried-out; and a controller 16d configured to control operations of individual components of the wafer inspection device 10 are arranged in each of the accommodation spaces 16.

In the inspection section 12, a chuck top 20 formed as a circular plate-shaped member on which the wafer W is placed and attracted is placed corresponding to each tester 15 such that the chuck top 20 faces the probe card 18. The chuck top 20 is supported by an aligner 21, and the aligner 21 vertically and horizontally moves the chuck top 20 to allow the wafer W placed on the chuck top 20 to directly face the probe card 18.

In the transfer section 14, a movable transfer robot 19 is provided. The transfer robot 19 is configured to receive the wafer W from the port 16a of the loading/unloading section 13 and transfer the wafer W to the chuck top 20 corresponding to each tester 15 and also transfer the wafer W to the port 16a from the chuck top 20 corresponding to each tester 15 after the inspection on electrical characteristics of semiconductor devices on the wafer W is completed. Further, the transfer robot 19 is configured to transfer a probe card 18 in need of maintenance to the loader 16c of the loading/unloading section 13 from each tester 15 and also transfer a new probe card 18 or a probe card 18 for which the maintenance is completed to each tester 15 from the loader 16c.

In the wafer inspection device 10, each tester 15 inspects the electrical characteristics of the semiconductor devices on the transferred wafer, and while the transfer robot 19 transfers a wafer toward a tester 15, another tester 15 can inspect the electrical characteristics of the semiconductor devices on another wafer. Thus, inspection efficiency of wafers can be improved.

Figure 3:
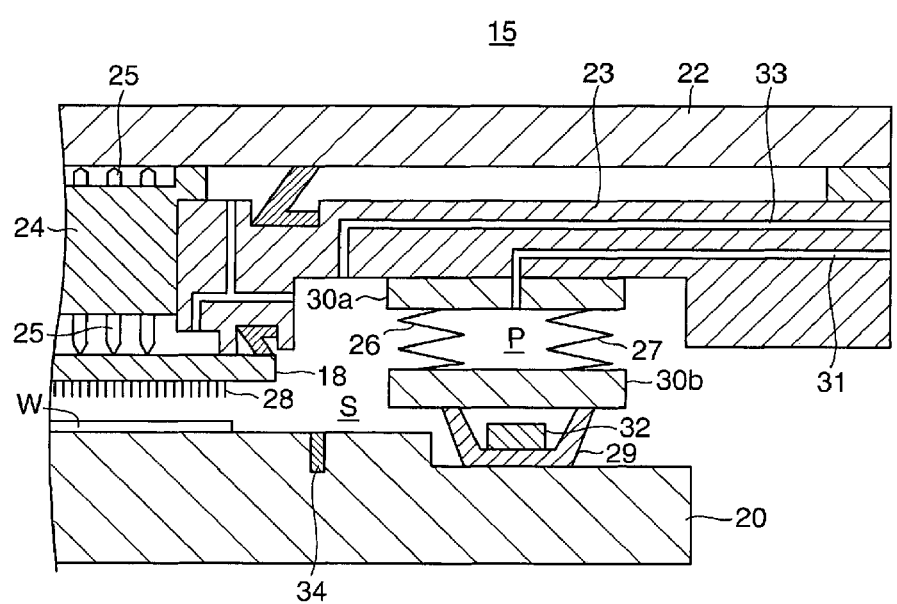
FIG. 3 is a partially enlarged cross sectional view illustrating a lower portion of a tester in the wafer inspection device shown in FIG. 1.

FIG. 3 is a partially enlarged cross sectional view illustrating a lower portion of the tester in the wafer inspection device shown in FIG. 1.

In FIG. 3, a motherboard 22 is embedded in the tester 15. The motherboard 22 has a structure approximately identical to a motherboard of a PC in which the semiconductor devices whose electrical characteristics are inspected are mounted. By reproducing a state close to the state in which the semiconductor devices are mounted in the motherboard of the PC through the motherboard 22, the tester 15 inspects the electrical characteristics of the semiconductor devices.

A pogo frame 23 is placed under the motherboard 22, and a space between the motherboard 22 and the pogo frame 23 is decompressed, so that the motherboard 22 vacuum-attracts the pogo frame 23. Further, the probe card 18 is placed under the pogo frame 23, and a space between the pogo frame 23 and the probe card 18 is decompressed, so that the pogo frame 23 vacuum-attracts the probe card 18.

A frame-shaped pogo block 24 is placed at a central portion of the pogo frame 23, and the pogo block 24 holds multiple pogo pins 25 electrically connecting the probe card 18 and the motherboard 22. The chuck top 20 is placed under the probe card 18, and the probe card 18 includes multiple contact probes 28 on a lower surface thereof such that the contact probes 28 face the chuck top 20.

In the pogo frame 23, an internal bellows 26 (a first bellows) which is a cylindrical corrugated member suspending toward the chuck top 20 to surround the contact probes 28 and an external bellows 27 (a second bellows) which is a cylindrical corrugated member suspending toward the chuck top 20 to surround the internal bellows 26 are placed concentrically with the probe card 18. The internal bellows 26 and the external bellows 27 can expand and contract in up and down directions in the drawing. Further, the internal bellows 26 and the external bellows 27 may be configured to suspend from the probe card 18.

A lip seal 29 made of elastomer is placed concentrically with the chuck top 20 to surround the wafer W placed on the chuck top 20 and face the internal bellows 26 and the external bellows 27. Further, ring-shaped contact members 30a and 30b are respectively provided on an upper end and a lower end of each of the internal bellows 26 and the external bellows 27. The ring-shaped contact member 30a is in contact with the pogo frame 23 and the ring-shaped contact member 30b is in contact with the lip seal 29. The internal bellows 26 and the external bellows 27 form a sealing space P between the internal bellows 26 and the external bellows 27 in cooperation with the contact members 30a and 30b. The sealing space P is compressed by a gas supplied from a compression path 31 that communicates the sealing space P with a compressing unit (not illustrated) provided outside. When the sealing space P is compressed, a pressing force (hereinafter, referred to as "bellows pressing force") that presses the contact member 30b by the internal bellows 26 and the external bellows 27 is generated. The bellows pressing force is applied to the chuck top 20 via the contact member 30b and the lip seal 29. As described above, the lip seal 29 is placed concentrically with the chuck top 20, and, thus, a point of application of a resultant force of the bellows pressing forces applied to respective spots of the lip seal 29 is a center of the chuck top 20. Further, a stopper 32, which is made of a hard member, e.g., a resin member and has a predetermined height, is placed within the lip seal 29. Thus, even if the bellows pressing force is applied to the lip seal 29, it is possible to suppress the lip seal 29 from being excessively compressed and suppress decrease in restoration force of the lip seal 29.

In the tester 15, when the internal bellows 26 and the external bellows 27 press the contact member 30b, the contact member 30b is brought into contact with the lip seal 29. Thus, a closed space S surrounded by the pogo frame 23, the internal bellows 26, the lip seal 29 and the chuck top 20 is formed. The closed space S is decompressed and contracted by a decompression path 33 that communicates the closed space S with a decompressing unit (not illustrated) provided outside. Thus, the chuck top 20 is pulled toward the pogo frame 23, so that the contact probes 28 of the probe card 18 placed under the pogo frame 23 are brought into contact with electrode pads and solder bumps in the semiconductor devices on the wafer W placed on the chuck top 20. Here, an electric current is allowed to flow from the contact probes 28 to electric circuits of the semiconductor devices connected with the electrode pads and the solder bumps, so that the inspection on electrical characteristics, such as conduction state, of the electric circuits is carried out.

Further, multiple height sensors 34 are provided in the chuck top 20 to face the pogo frame 23, and each height sensor 34 is configured to measure a distance (height) between the corresponding spot of the chuck top 20 and the pogo frame 23. In the present exemplary embodiment, an inclination of the chuck top 20 with respect to the pogo frame 23 is calculated based on the distances between the spots of the chuck top 20 and the pogo frame 23 measured by the respective height sensors 34. Further, the height sensors 34 may be provided in the pogo frame 23 rather than in the chuck top 20 and may measure distances (heights) between respective spots of the pogo frame 23 and the chuck top 20.

FIG. 4A to FIG. 4D are process diagrams of describing operations of a chuck top and the like in a substrate inspection method according to the present exemplary embodiment.

Figure 4A:
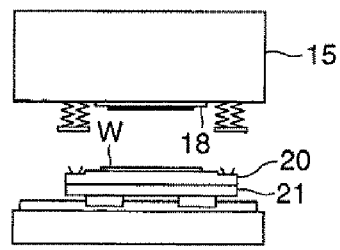
FIG. 4A to FIG. 4D are process diagrams of describing operations of a chuck top and the like in a substrate inspection method according to the present exemplary embodiment.
Figure 4B:
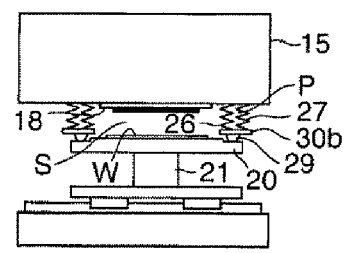

Firstly, the aligner 21 moves the chuck top 20 that has received the wafer W from the transfer robot 19 to allow the wafer W placed on the chuck top 20 to face the probe card 18 (FIG. 4A). Then, as the aligner 21 is raised to make the chuck top 20 approach the pogo frame 23 (the tester 15), the internal bellows 26 and the external bellows 27 are brought into contact with the lip seal 29 via the contact member 30b. Here, the closed space S surrounded by the pogo frame 23 (the tester 15), the internal bellows 26, the lip seal 29, and the chuck top 20 is formed (FIG. 4B). Further, a gas is supplied from the compression path 31 into the sealing space P between the internal bellows 26 and the external bellows 27 and the sealing space P is compressed, so that the bellows pressing force is generated. The bellows pressing force presses the chuck top 20 via the contact member 30b or the lip seal 29.

Figure 4C:
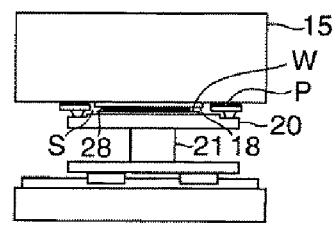

Then, as the aligner 21 continues to be raised, the contact probes 28 of the probe card 18 are brought into contact with the electrode pads and the solder bumps in the semiconductor devices on the wafer W placed on the chuck top 20. Even after that, the aligner 21 presses (over-drives) the chuck top 20 toward the pogo frame 23 (the tester 15) and thus continues to bring the contact probes 28 into contact with the electrode pads and the solder bumps. Further, the closed space S is decompressed by the decompressing unit, so that the chuck top 20 is attracted toward the pogo frame 23 (FIG. 4C). Furthermore, during the over-driving operation, the sealing space P is continuously compressed, so that the chuck top 20 is continuously pressed by the bellows pressing force.

Figure 5A:
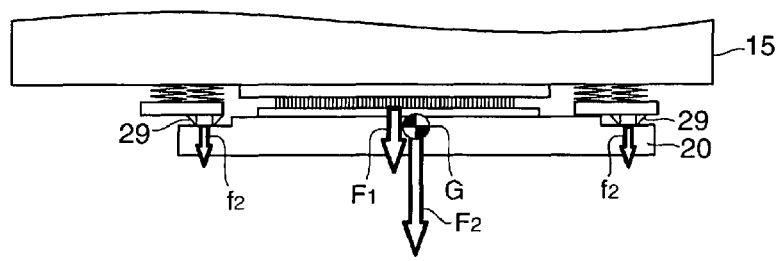
FIG. 5A to FIG. 5C are diagrams of describing the principle of controlling an inclination of the chuck top in the substrate inspection method according to the present exemplary embodiment.
Figure 5B:
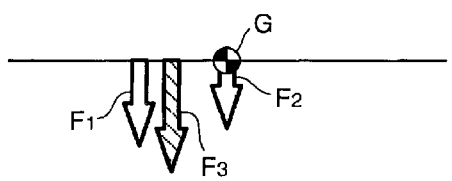
Figure 5C:
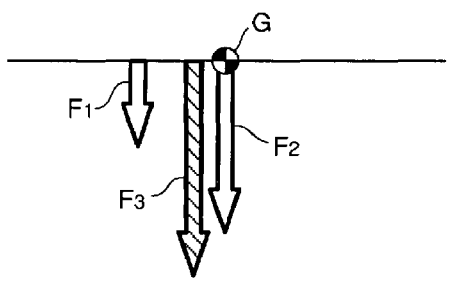

Here, for example, in a case that the semiconductor devices are formed in an offset position with respect to a center of the wafer W, a center of the probe card 18 cannot correspond to the center of the wafer W but corresponds to the offset position with respect to the center of the wafer W since the contact probes 28 are brought into contact with the electrode pads and the solder bumps in the semiconductor devices. Here, the wafer W is placed on the chuck top 20 so as to be concentric with the chuck top 20, whereas the contact probes 28 are placed symmetrically with respect to the center of the probe card 18. Therefore, a resultant force of reaction forces from the respective contact probes 28 toward the wafer W (the chuck top 20) is applied to the offset position with respect to the center of the wafer W (the chuck top 20) rather than to the center of the wafer W (the chuck top 20). Specifically, as shown in FIG. 5A, a resultant force $F_1$ of the reaction forces from the respective contact probes 28 is applied to an offset position with respect to a center G of the chuck top 20. Meanwhile, since the lip seal 29 is placed concentrically with the chuck top 20, a resultant force $F_2$ of the bellows pressing forces $f_2$ applied to the chuck top 20 via the lip seal 29 is applied to the center G of the chuck top 20. Therefore, a point of application of a resultant force $F_3$ of the resultant force $F_1$ and the resultant force $F_2$ can be closer to the center G of the chuck top 20 than a point of application of the resultant force $F_1$. A location of the point of application of the resultant force $F_3$ is determined by a ratio of the magnitudes of the resultant force $F_1$ and the resultant force $F_2$. For example, as shown in FIG. 5B, when the resultant force $F_1$ is greater than the resultant force $F_2$, the point of application of the resultant force $F_3$ approaches the point of application of the resultant force $F_1$, and as shown in FIG. 5C, when the resultant force $F_2$ is greater than the resultant force $F_1$, the point of application of the resultant force $F_3$ approaches the point of application of the resultant force $F_2$, i.e., the center G of the chuck top 20. A moment applied to the chuck top 20 is caused by the resultant force $F_3$. Therefore, by allowing the point of application of the resultant force $F_3$ to approach the center G of the chuck top 20, the corresponding moment can be reduced. Thus, it is possible to suppress the chuck top 20 from being inclined. Accordingly, it is possible to accurately carry out the inspection on the electrical characteristics of the semiconductor devices on the wafer W.

In the wafer inspection device 10, in order to make the point of application of the resultant force $F_3$ approach the center G of the chuck top 20, a pressure of the sealing space P is determined to make the resultant force $F_2$ greater than the resultant force $F_1$. Specifically, the pressure of the sealing space P is determined such that the resultant force $F_2$, which is at least three times the resultant force $F_1$, is applied to the chuck top 20. Further, the pressure of the sealing space P is determined based on the inclination of the chuck top 20 calculated from the distances between the spots of the chuck top 20 and the pogo frame 23 measured by the respective height sensors 34. For example, if the inclination of the chuck top 20 is high, the pressure of the sealing space P is determined to make a relative increase in the resultant force $F_2$. If the inclination of the chuck top 20 is not so high, the pressure of the sealing space P is determined to make a relative decrease in the resultant force $F_2$. That is, in the wafer inspection device 10, the inclination of the chuck top 20 can be regulated just by changing the pressure of the sealing space P. Therefore, it is not necessary to provide a balance weight for correcting the inclination of the chuck top 20.

Further, as a timing of compressing the sealing space P, a timing after the contact probes 28 are contacted with the electrode pads and the solder bumps may be considered. However, in this case, the contact probes 28 which have been in contact once are likely to be separated and deviated from the electrode pads and the solder bumps due to a new load of the bellows pressing forces $f_2$. Therefore, as the timing of compressing the sealing space P, it is desirable to compress the sealing space P before the contact probes 28 are contacted with the electrode pads and the solder bumps. Thus, after the contact probes 28 are contacted with the electrode pads and the solder bumps, the bellows pressing forces $f_2$ are not newly applied. Therefore, it is possible to suppress the separation and the deviation of the contact probes 28 from the electrode pads and the solder bumps.

Figure 4D:
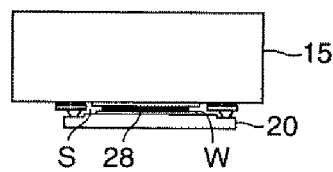

Then, the aligner 21 is lowered, but the closed space S is still decompressed. Therefore, the chuck top 20 continues to be attracted toward the pogo frame 23 (the tester 15), so that the contact probes 28 continue to be in contact with the electrode pads and the solder bumps in the semiconductor devices (FIG. 4D).

The exemplary embodiment of the present disclosure has been described above, but the present disclosure is not limited to the above-described exemplary embodiments.

For example, in the present exemplary embodiment, the sealing space P is compressed to regulate the inclination of the chuck top 20. Meanwhile, the bellows pressing forces $f_2$ are applied in the opposite direction from contact forces of the contact probes 28 on the electrode pads and the solder bumps caused by decompression of the closed space S. Therefore, the contact forces of the contact probes 28 on the electrode pads and the solder bumps can be reduced by regulating the pressure of the sealing space P, so that it is possible to suppress marks of needles of the contact probes 28 from being left on the electrode pads and the solder bumps.

Further, the internal bellows 26 and the external bellows 27 apply the bellows pressing forces $f_2$ to the chuck top 20 via the contact member 30b or the lip seal 29, but the internal bellows 26 and the external bellows 27 may be provided to be in direct contact with the chuck top 20 without the contact member 30b or the lip seal 29. As a result, by compressing the sealing space P surrounded by the internal bellows 26, the external bellows 27, the pogo frame 23, and the chuck top 20, the bellows pressing forces $f_2$ may be applied to the chuck top 20.

Furthermore, if the lip seal 29 attracts the contact member 30b, the sealing space P may be decompressed. Thus, the internal bellows 26 and the external bellows 27 can pull the chuck top 20 via the lip seal 29. Therefore, it is possible to securely bring the contact probes 28 into contact with the electrode pads and the solder bumps.

Figure 6:
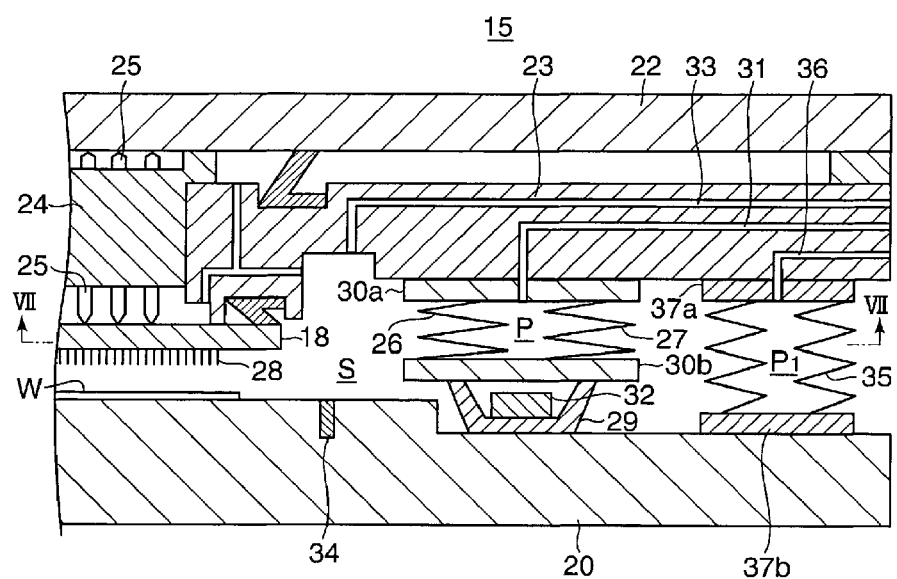
FIG. 6 is a partially enlarged cross sectional view illustrating a lower portion of a tester in a first modification example of the wafer inspection device shown in FIG. 1.

Moreover, other bellows may be provided besides the internal bellows 26 and the external bellows 27. FIG. 6 is a partially enlarged cross sectional view illustrating a lower portion of a tester in a first modification example of the wafer inspection device shown in FIG. 1, and FIG. 7 is a horizontal cross sectional view taken along a line VII-VII in FIG. 6.

Figure 7:
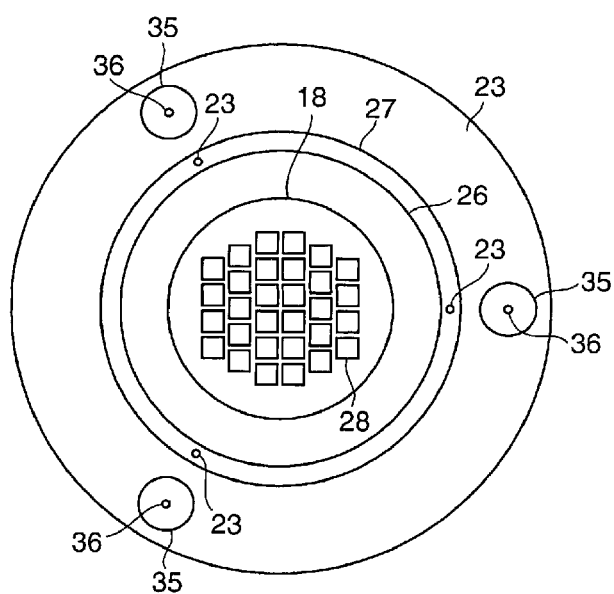
FIG. 7 is a horizontal cross sectional view taken along a line VII-VII in FIG. 6.

As shown in FIG. 6 and FIG. 7, in the first modification example, multiple, e.g., three auxiliary bellows 35, each of which is a cylindrical corrugated member and suspends from the pogo frame 23 toward the chuck top 20, are arranged around (outside) the external bellows 27. The auxiliary bellows 35 can expand and contract in up and down directions and are approximately equi-spaced along a circumferential direction of the external bellows 27. Circular plate-shaped contact members 37a and 37b are provided on an upper end and a lower end of each auxiliary bellows 35, and the contact member 37a is in contact with the pogo frame 23 and the contact member 37b is in contact with the chuck top 20. Each auxiliary bellows 35 forms a sealing space $P_1$ therein, and the sealing space $P_1$ is compressed by a gas supplied from a compression path 36 that communicates the sealing space $P_1$ with a compressing unit (not illustrated) provided outside. When the sealing space $P_1$ is compressed, a pressing force (hereinafter, referred to as "auxiliary bellows pressing force") that presses the contact member 37b by the auxiliary bellows 35 is generated. The auxiliary bellows pressing force is applied to the chuck top 20 via the contact member 37b. Here, as described above, the auxiliary bellows 35 are approximately equi-spaced along the circumferential direction of the external bellows 27, i.e., arranged in a distributed manner. Therefore, the auxiliary bellows pressing forces are distributed on the chuck top 20 and locally applied thereto. Here, if a pressure of the sealing space $P_1$ of each auxiliary bellows 35 is individually changed, auxiliary bellows pressing forces having different magnitudes may be applied to respective spots of the chuck top 20. Thus, it is possible to minutely control the inclination of the chuck top 20. Accordingly, it is possible to securely suppress the chuck top 20 from being inclined. Further, the auxiliary bellows 35 are arranged around the external bellows 27. Therefore, the auxiliary bellows pressing forces are applied to a greatly offset position with respect to the center G of the chuck top 20. Thus, a moment caused by the auxiliary bellows pressing forces applied to the chuck top 20 is increased. Therefore, even if the auxiliary bellows pressing forces are small, it is possible to greatly pivot the chuck top 20. That is, even if a relatively small auxiliary bellows 35 is used, it is possible to efficiently regulate the inclination of the chuck top 20.

Figure 8:
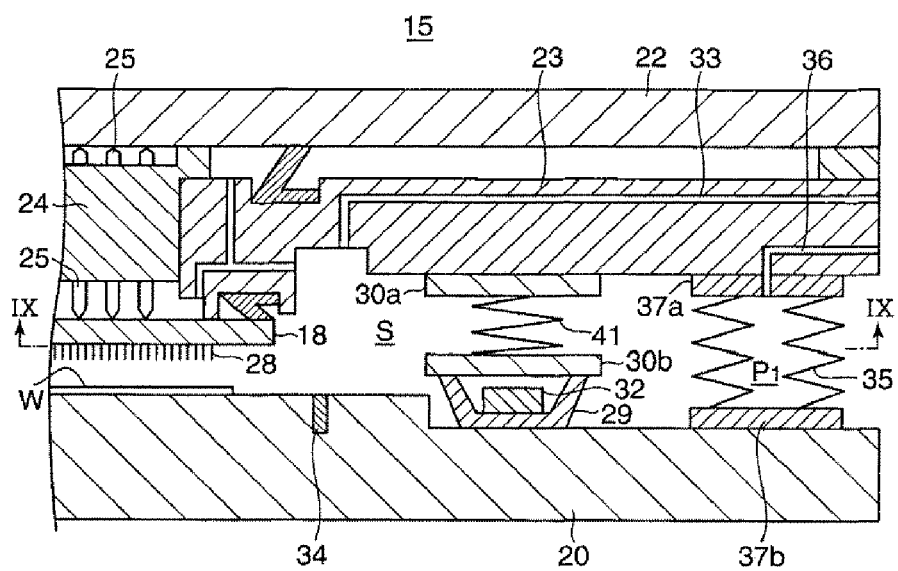
FIG. 8 is a partially enlarged cross sectional view illustrating a lower portion of a tester in a second modification example of the wafer inspection device shown in FIG. 1.

As described above in the first modification example, if the multiple auxiliary bellows 35 are provided, the bellows surrounded by the auxiliary bellows 35 does not have to be a dual bellows including the internal bellows 26 and the external bellows 27. FIG. 8 is a partially enlarged cross sectional view illustrating a lower portion of a tester in a second modification example of the wafer inspection device shown in FIG. 1, and FIG. 9 is a horizontal cross sectional view taken along a line IX-IX in FIG. 8.

Figure 9:
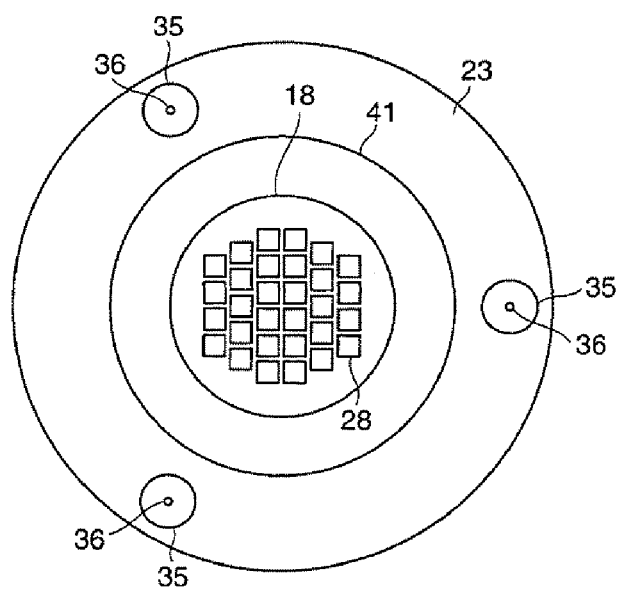
FIG. 9 is a horizontal cross sectional view taken along a line IX-IX in FIG. 8.

As shown in FIG. 8 and FIG. 9, in the second modification example of the wafer inspection device 10 illustrated in FIG. 1, a single main bellows 41 is arranged to be surrounded by the three auxiliary bellows 35. In the same manner as for the internal bellows 26, the main bellows 41 is formed as a cylindrical corrugated member that can expand and contract in up and down directions and suspends from the pogo frame 23 toward the chuck top 20 to surround the contact probes 28. In the same manner as for the internal bellows 26, the ring-shaped contact members 30a and 30b are provided on an upper end and a lower end of the main bellows 41, and the ring-shaped contact member 30a is in contact with the pogo frame 23 and the ring-shaped contact member 30b is in contact with the lip seal 29, but the above-described sealing space P is not formed.

Further, in the above-described second modification example, each of three auxiliary bellows 35 arranged around (outside) the main bellows 41 forms the sealing space $P_p$ and the sealing space $P_1$ is compressed by a gas supplied from the compression path 36. Thus, the auxiliary bellows 35 can generate the auxiliary bellows pressing force, and the auxiliary bellows pressing forces are applied to the chuck top 20 via the contact member 37b. Here, a pressure of the sealing space $P_1$ of each auxiliary bellows 35 is individually changed and the auxiliary bellows pressing forces having different magnitudes are applied to respective spots of the chuck top 20. Thus, it is possible to minutely control the inclination of the chuck top 20.

Furthermore, in the above-described first modification example and second modification example of the wafer inspection device 10, elastic members such as coil springs may be provided instead of the auxiliary bellows 35. In this case, by individually changing a spring constant of each elastic member, elastic forces having different magnitudes are applied to respective spots of the chuck top 20. Accordingly, it is possible to securely suppress the chuck top 20 from being inclined.

Figure 10:
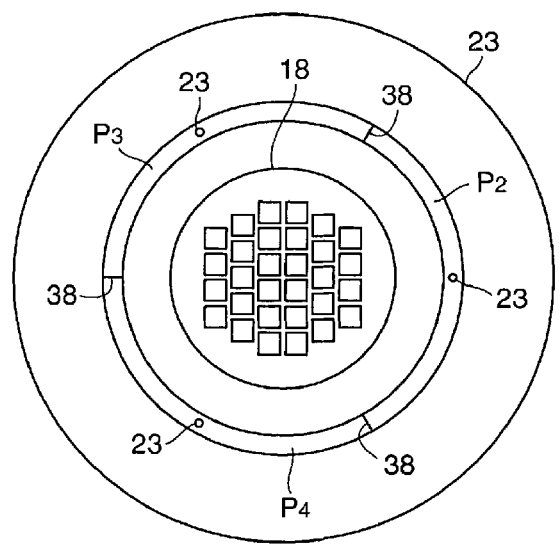
FIG. 10 is a partially enlarged cross sectional view illustrating a lower portion of a tester in a third modification example of the wafer inspection device shown in FIG. 1.

Moreover, in a third modification example of the wafer inspection device illustrated in FIG. 1, the sealing space P between the internal bellows 26 and the external bellows 27 may be partitioned into multiple, e.g., three, partitioned spaces $P_2$ to $P_4$ by multiple partition walls 38 approximately equi-spaced along the circumferential direction as shown in FIG. 10. Further, by individually changing a pressure of each of the partitioned spaces $P_2$ to $P_4$, bellows pressing forces $f_2$ having different magnitudes may be applied from the respective partitioned spaces $P_2$ to $P_4$ to the chuck top 20. Thus, it is possible to locally apply the bellows pressing forces $f_2$ having different magnitudes to the chuck top 20. Thus, it is possible to minutely control the inclination of the chuck top 20. Accordingly, it is possible to securely suppress the chuck top 20 from being inclined.

Figure 11:
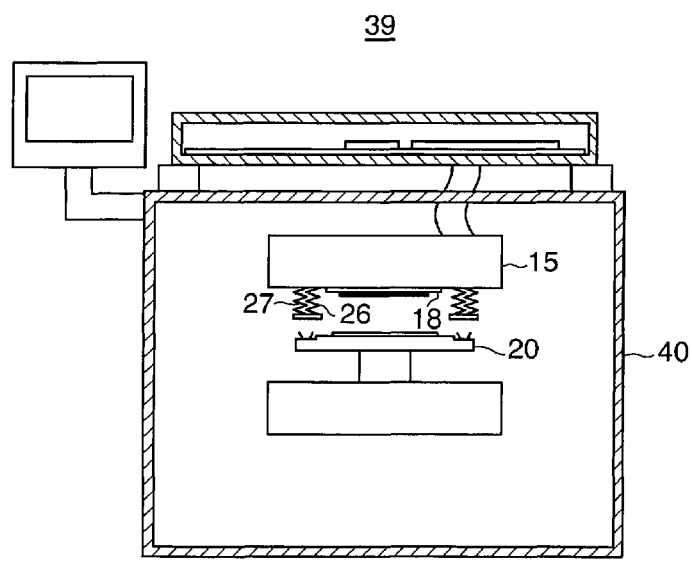
FIG. 11 is a cross sectional view schematically illustrating a configuration of another wafer inspection device to which the present exemplary embodiment is applied.
Figure 12A:
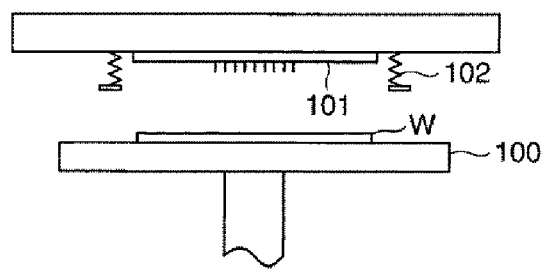
FIG. 12A to FIG. 12D are diagrams of describing operations of a chuck top and the like in a conventional wafer inspection device.
Figure 12B:
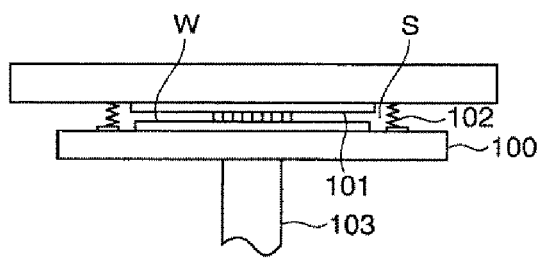
Figure 12C:
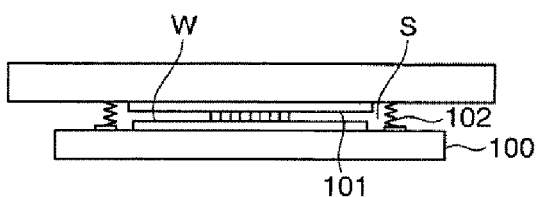
Figure 12D:
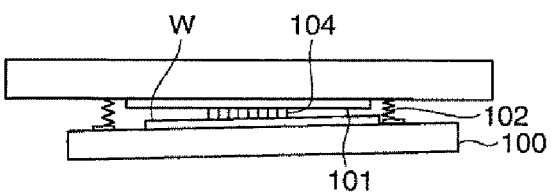

Besides, in the present exemplary embodiment, there has been described a case where the present disclosure is applied to the wafer inspection device capable of simultaneously carrying out the inspection on the electrical characteristics of the semiconductor devices on multiple wafers. However, the present disclosure can also be applied to a wafer inspection device that carries out the inspection on the electrical characteristics of the semiconductor devices on a single wafer. In this case, a wafer inspection device 39 includes, for example, the tester 15 (the pogo frame 23), the probe card 18, the chuck top 20, the internal bellows 26, and the external bellows 27 in a single inspection chamber 40 (FIG. 11).

This patent application claims the benefit of priority to Japanese Patent Application No. 2016-189999 filed on Sep. 28, 2016 and incorporated herein by reference in its entirety.

EXPLANATION OF CODES

P: Sealing space
P2 to P4: Partitioned space
S: Closed space
W: Wafer
10: Wafer inspection device
18: Probe card 20: Chuck top
26: Internal bellows
27: External bellows
28: Contact probe
34: Height sensor
35: Auxiliary bellows
41: Main bellows

We claim:

1. A substrate inspection device, including a plate-shaped member on which a substrate having devices formed thereon is placed and a probe card which is placed above the plate-shaped member to face the plate-shaped member and has multiple needle-shaped contact probes protruding toward the substrate, in which the contact probes are brought into contact with the devices by allowing the plate-shaped member to approach the probe card, the substrate inspection device comprising:
 a cylindrical first bellows configured to expand and contract and configured to suspend to surround the contact probes; and
 a cylindrical second bellows configured to expand and contract and configured to suspend to surround the first bellows,
 wherein when the plate-shaped member approaches the probe card, the first bellows and the second bellows are brought into contact with the plate-shaped member and a sealing space is formed between the first bellows and the second bellows, and
 the sealing space is compressed,
 wherein a pressure in the sealing space is determined such that a second resultant force of respective pressing forces of the first and second bellows applied to the plate-shaped member is to be larger than a first resultant force of reaction forces applied to the substrate by the contact probes.

2. The substrate inspection device of claim 1,
 wherein a center of a pressing force applied from the sealing space to the plate-shaped member is coincident with a center of the plate-shaped member.

3. The substrate inspection device of claim 1,
 wherein at least one cylindrical auxiliary bellows configured to expand and contract is placed around the second bellows, and
 when the plate-shaped member approaches the probe card, the auxiliary bellows is brought into contact with the plate-shaped member and an inside of the auxiliary bellows is compressed so that the auxiliary bellows applies a pressing force to the plate-shaped member.

4. The substrate inspection device of claim 1,
 wherein the sealing space between the first bellows and the second bellows is partitioned into multiple partitioned spaces, and
 the partitioned spaces respectively apply pressing forces to the plate-shaped member by individually compressing the partitioned spaces.

5. The substrate inspection device of claim 1, further comprising:
 a height sensor configured to measure a distance between the plate-shaped member and the probe card,
 wherein an inclination of the plate-shaped member is calculated based on the measured distance.

6. A substrate inspection method of allowing, in a substrate inspection device including a plate-shaped member on which a substrate having devices formed thereon is placed and a probe card which is placed above the plate-shaped member to face the plate-shaped member and has multiple needle-shaped contact probes protruding toward the substrate, the plate-shaped member to approach the probe card to bring the contact probes into contact with the devices, the substrate inspection method comprising:
 placing a cylindrical first bellows configured to expand and contract and configured to suspend to surround the contact probes and placing a cylindrical second bellows configured to expand and contract and configured to suspend to surround the first bellows;
 bringing, when the plate-shaped member approaches the probe card, the first bellows and the second bellows into contact with the plate-shaped member to form a sealing space between the first bellows and the second bellows; and
 compressing the sealing space,
 wherein a pressure in the sealing space is determined such that a second resultant force of respective pressing forces of the first and second bellows applied to the plate-shaped member is to be larger than a first resultant force of reaction forces applied to the substrate by the contact probes.

7. The substrate inspection method of claim 6,
 wherein a pressure of the sealing space is determined by an inclination of the plate-shaped member.

8. The substrate inspection method of claim 6,
 wherein a pressure of the sealing space is set such that a pressing force, which is at least three times a resultant force of reaction forces applied to the plate-shaped member from the contact probes, is applied to the plate-shaped member from the sealing space.

9. A substrate inspection device, including a plate-shaped member on which a substrate having devices formed thereon is placed and a probe card which is placed above the plate-shaped member to face the plate-shaped member and has multiple needle-shaped contact probes protruding toward the substrate, in which the contact probes are brought into contact with the devices by allowing the plate-shaped member to approach the probe card, the substrate inspection device comprising:
 a cylindrical main bellows configured to expand and contract and configured to suspend to surround the contact probes; and
 multiple cylindrical auxiliary bellows configured to expand and contract and configured to be placed around the main bellows, the multiple cylindrical auxiliary bellows being spaced apart from each other along a circumference of the main bellows in a distributed manner,
 wherein when the plate-shaped member approaches the probe card, the multiple cylindrical auxiliary bellows are brought into contact with the plate-shaped member, a respective inside of each of the multiple cylindrical auxiliary bellows is individually compressed so that the multiple auxiliary bellows apply respective pressing forces to the plate-shaped member, and
 a sealing space formed between a main bellows and an auxiliary bellows is compressed, wherein a pressure in the sealing space is determined such that a second resultant force of respective pressing forces of the main bellows and the auxiliary bellows applied to the plate-shaped member is to be larger than a first resultant force of reaction forces applied to the substrate by the contact probes.

* * * * *